United States Patent
Hofsäss et al.

(10) Patent No.: US 7,484,189 B2
(45) Date of Patent: Jan. 27, 2009

(54) METHOD FOR SEARCHING FOR POTENTIAL FAULTS IN A LAYOUT OF AN INTEGRATED CIRCUIT

(75) Inventors: Markus Hofsäss, München (DE); Eva-Maria Nash, Adelshofen (DE)

(73) Assignee: Qimonda AG, Munich (DE)

( * ) Notice: Subject to any disclaimer, the term of this patent is extended or adjusted under 35 U.S.C. 154(b) by 151 days.

(21) Appl. No.: 11/506,201

(22) Filed: Aug. 18, 2006

(65) Prior Publication Data

US 2007/0044050 A1 Feb. 22, 2007

(30) Foreign Application Priority Data

Aug. 20, 2005 (DE) .................. 10 2005 039 394

(51) Int. Cl.
G06F 17/50 (2006.01)
G06F 19/00 (2006.01)
G06F 11/00 (2006.01)
G01R 31/26 (2006.01)
G01R 31/317 (2006.01)
G01R 21/00 (2006.01)

(52) U.S. Cl. .................. 716/4; 702/59; 702/117; 714/27; 703/14; 700/97; 700/110; 700/121

(58) Field of Classification Search .................. 716/4; 702/59, 117; 714/27; 703/14; 700/97, 110, 700/121
See application file for complete search history.

(56) References Cited

U.S. PATENT DOCUMENTS

| | | | | |
|---|---|---|---|---|
| 5,539,652 A * | 7/1996 | Tegethoff | .................. | 703/14 |
| 5,659,717 A * | 8/1997 | Tse et al. | .................. | 716/7 |
| 5,705,301 A | 1/1998 | Garza et al. | | |
| 6,289,488 B1 * | 9/2001 | Dave et al. | .................. | 716/1 |
| 6,397,373 B1 | 5/2002 | Tseng et al. | | |
| 6,473,665 B2 * | 10/2002 | Mugibayashi et al. | ........ | 700/110 |
| 6,823,500 B1 * | 11/2004 | Ganesh et al. | .................. | 716/9 |
| 6,885,950 B2 * | 4/2005 | Mitsutake et al. | .................. | 702/58 |
| 7,260,790 B2 * | 8/2007 | Allen et al. | .................. | 716/2 |
| 7,313,776 B2 * | 12/2007 | Kaul et al. | .................. | 716/10 |
| 2002/0053065 A1 * | 5/2002 | Misutake et al. | .................. | 716/4 |
| 2005/0005199 A1 * | 1/2005 | Yoda | .................. | 714/37 |
| 2005/0097481 A1 * | 5/2005 | Mitsutake et al. | .................. | 716/2 |
| 2005/0108669 A1 * | 5/2005 | Shibuya | .................. | 716/9 |
| 2005/0125756 A1 | 6/2005 | Ditlow et al. | | |
| 2006/0026472 A1 * | 2/2006 | Adkisson et al. | .................. | 714/726 |
| 2006/0095877 A1 * | 5/2006 | Su et al. | .................. | 716/5 |
| 2006/0150130 A1 * | 7/2006 | Allen et al. | .................. | 716/5 |
| 2006/0294485 A1 * | 12/2006 | Kaul et al. | .................. | 716/10 |

\* cited by examiner

*Primary Examiner*—Phallaka Kik
(74) *Attorney, Agent, or Firm*—Patterson & Sheridan, L.L.P.

(57) ABSTRACT

A layout comprises a plurality of elemental areas which define the shape and arrangement of patterns of an integrated circuit. A method for searching for potential faults in the layout begins with dividing the layout into sections. One of a number of predetermined classes is allocated to a section by means of allocation criteria. An evaluation criterion allocated to the class which was allocated to the section is then applied to the section in order to obtain an evaluation result. Each section is then identified as potentially faulted in dependence on the evaluation result.

20 Claims, 3 Drawing Sheets

METHOD FOR SEARCHING FOR POTENTIAL FAULTS IN A LAYOUT OF AN INTEGRATED CIRCUIT

CLAIM FOR PRIORITY

This application claims the benefit of priority to German Application No. 10 2005 039 394.2-53, filed Aug. 20, 2005, the contents of which are hereby incorporated by reference.

TECHNICAL FIELD OF THE INVENTION

The present invention relates to a method for searching for potential faults in a layout of an integrated circuit. Such methods are also called "design rule checks" (DRC).

BACKGROUND OF THE INVENTION

An important step in the development of an integrated semiconductor circuit is the development or design, respectively, of the layout. The layout consists of a multiplicity of elemental areas which define the shape and arrangement of patterns of the integrated circuit. As a rule, the patterns are arranged in a number of planes lying above one another in the completed integrated circuit. Correspondingly, the elements of the layout are also attributed or assigned to various planes or layers, respectively. In most cases, an engineer designs the layer manually, supported by software.

An integrated semiconductor circuit can contain a very large number of transistors, resistors, capacitors and other circuit elements. To these are added wiring lines within a number of planes and between these planes. Each of these elements is defined by one, but as a rule by a number of elemental areas of the layout. The operation of all circuit elements and of the integrated circuit overall is dependent on the dimensions of the elemental areas, on their relative arrangement and, in particular, on their dimensions and spacings. For this reason, for example, minimum widths, minimum areas and minimum distances apply, as a rule. If these are not maintained, the patterns are not completely created, for example in lithography steps, or conversely joined to one another by unwanted bridges, or in the case of etching steps, openings in a layer are not completely created or patterns which are too small are completely removed.

To avoid such faults in the production of the integrated circuit, a layout is subjected to an extensive check after having been designed and before lithography masks are produced. As a rule, this check proceeds in two phases. In a first phase, possible faults are identified. This is often done in an automated manner by means of a corresponding software and is also called design rule check. In a second phase, all positions of the layout identified as potential faults are checked and, if necessary, corrected.

As a rule, a layout is subjected not only to a single but to a multiplicity of design rule checks. Design rule checks are used, in particular, for checking the linear dimensions of the elemental areas maintained in the layout for whether minimum distances and minimum widths are maintained.

However, there are other important design criteria, the checking of which leads to an avoidance of faults.

SUMMARY OF THE INVENTION

The present invention discloses an improved method for searching for potential faults in a layout of an integrated circuit by means of which method other potential faults, which are not identified by conventional design rule checks, are identified.

In one embodiment of the present invention, there is a method for searching for potential faults of a layout of an integrated circuit, the layout comprising a plurality of elemental areas which define the shape and arrangement of patterns of the integrated circuit, the method comprising: a) dividing the layout into sections, b) allocating one of a number of predetermined classes to a section by means of allocation criteria, wherein an evaluation criterion is allocated to each class, c) applying the evaluation criterion allocated to the class which was allocated to the section in step b) to the section in order to obtain an evaluation result, and d) identifying the section as potentially faulted section in dependence on the evaluation result.

In another embodiment of the present invention, there is a method for correcting a layout of an integrated circuit, the layout comprising a plurality of elemental areas which define the shape and arrangement of patterns of the integrated circuit, the method comprising: searching for potentially faulted sections of the lay-out in accordance with a method according to the above described embodiment, identifying a potentially faulted section as actually faulted by means of further criteria, and correcting a section if it has been identified as actually faulted in the preceding step.

In yet another embodiment of the present invention, there is a method for producing an integrated circuit, the method comprising: designing a layout for the integrated circuit, correcting the layout in accordance with a method according to the first above described embodiment, and producing the integrated circuit in accordance with the corrected layout.

BRIEF DESCRIPTION OF THE DRAWINGS

These above recited features of the present invention will become clear from the following description, taken in conjunction with the accompanying drawings. It is to be noted, however, that the accompanying drawings illustrate only typical embodiments of the present invention and are, therefore, not to be considered limiting of the scope of the invention. The present invention may admit other equally effective embodiments.

DETAILED DESCRIPTION OF THE INVENTION

Figure 1:
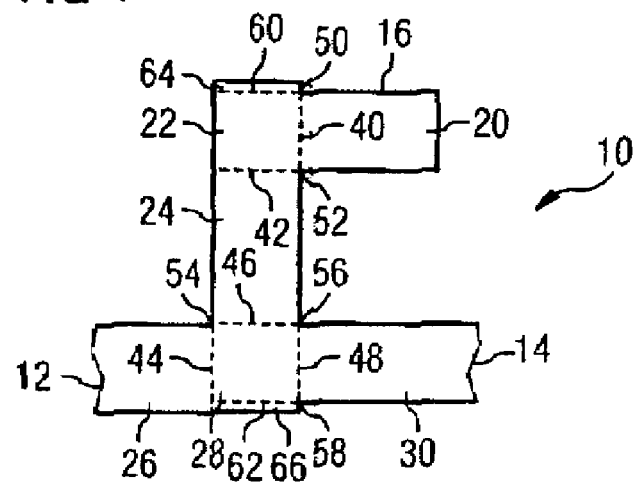
FIGS. 1 to 4 show views of sections of a layout.

FIG. 1 shows a representation of an example of a section of a layout of an integrated circuit. In particular, a part of an elemental area 10 is shown which can be arbitrarily continued beyond the arbitrary breaks 12, 14. The elemental area 10 is a right-angled polygon in this example. Its edge 16, therefore, has sections which are arranged in a total of two virtually perpendicular directions. As an alternative, the elemental area 10, in deviation from the representation in FIG. 1, also has straight edge sections with other directions, for example with directions parallel to the bisector of the two directions which can be seen in FIG. 1. The present invention can also be extended to elemental areas with arbitrary edges.

The elemental area 10 is first divided into sections 20, 22, 24, 26, 28, 30. Boundaries 40, 42, 44, 46, 48 between the sections 20, 22, 24, 26, 28, 30 are formed by straight extensions of straight edge sections beyond adjoining convex corners 50, 52, 54, 56, 58. Due to this design rule, apart from the actual boundaries 40 to 48 mentioned, other possible boundary lines 60, 62 are produced which, however, are not used for separating two sections. If these possible boundary lines 60, 62 were to be used, very small sections 64, 66 would be produced which do not bring any further advantage for the subsequent evaluation. These small sections 64, 66 are therefore added to the sections 22 and 28 or use of the possible boundary lines 60, 62 as boundaries for separating sections is avoided from the beginning.

As a criterion for using a possible boundary line as boundary between two sections, the size of the sections produced can be used, for example. A further advantageous criterion is whether the possible boundary line ends at the edge 16 of the elemental area 10 without first intersecting another boundary. This is not the case with the possible boundary line 62. Using this criterion, a division into the sections 20, 22, 24, 26, 28, 30 and 64 is thus obtained.

It is clear that the division of the elemental area 10 into the sections 20, 22, 24, 26, 28, 30 greatly depends on the method used during a process or, respectively, on the criteria set up for it which, in turn, are arbitrary up to a certain degree. The design of possible boundary lines as perpendicular to straight sections of the edge 16 in convex corners adjoining the straight edge sections can be mentioned as a further example of advantageous dividing criteria. This is of advantage, in particular, in the case of non-rectangular polygons.

Figure 2:
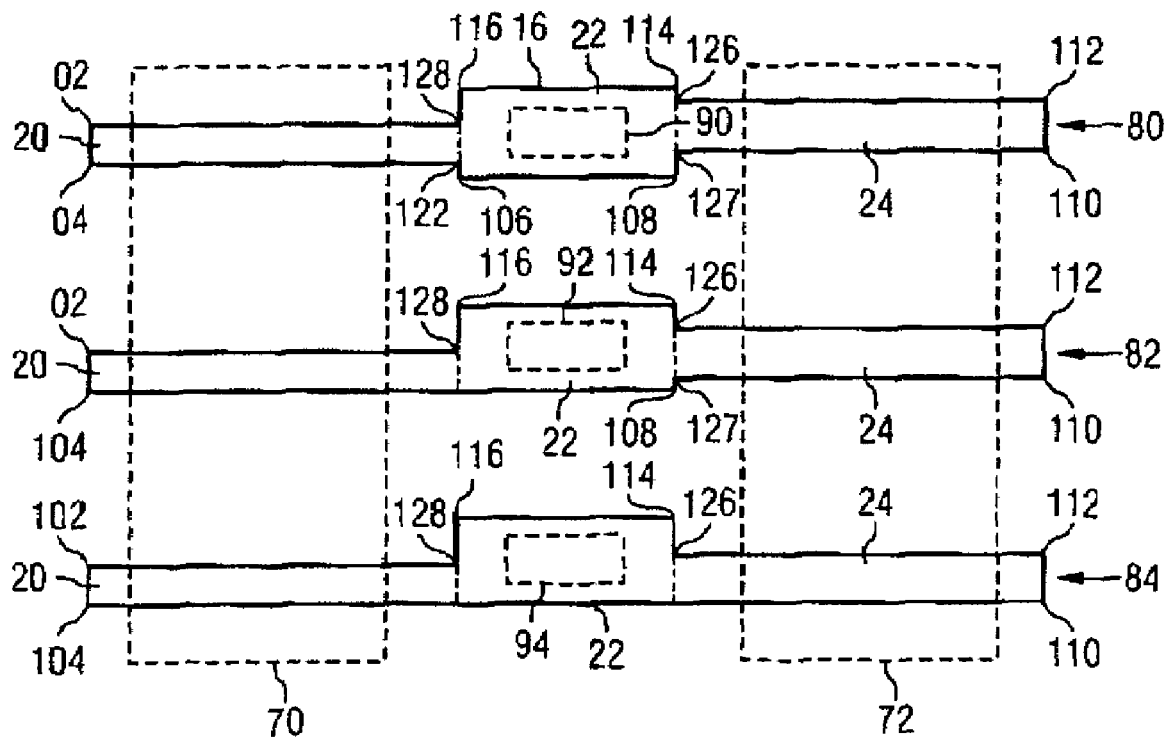
Figure 3:
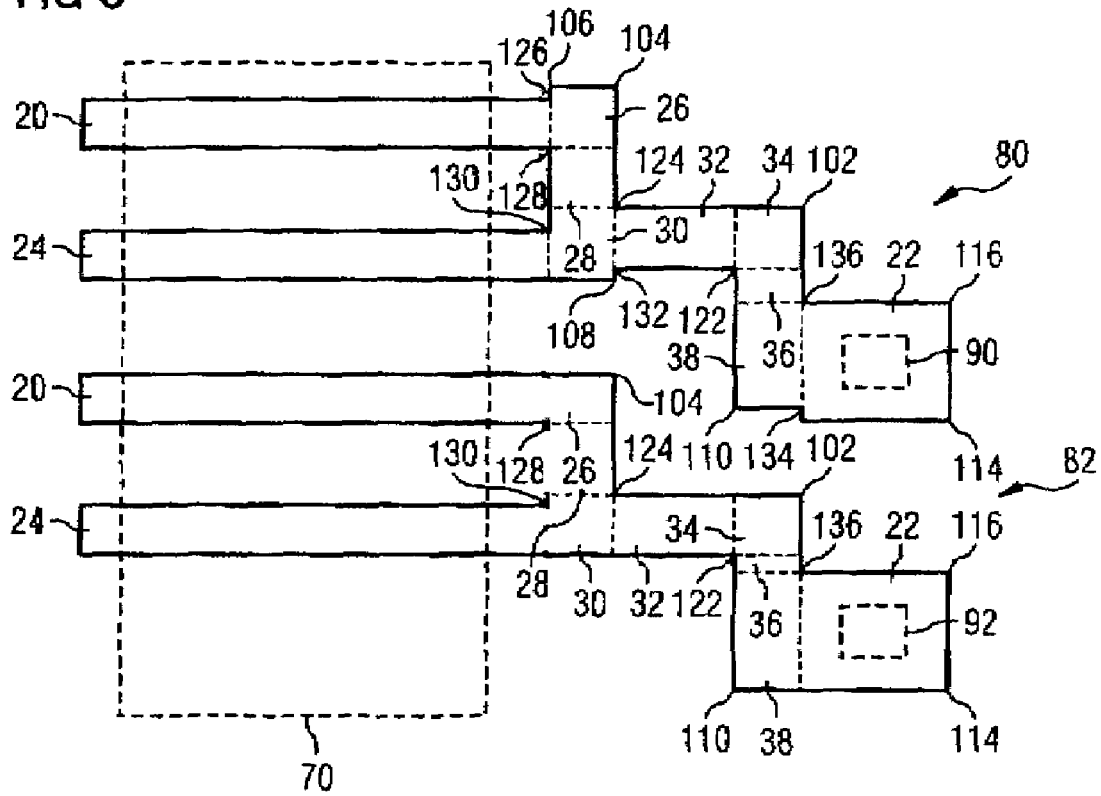
Figure 4:
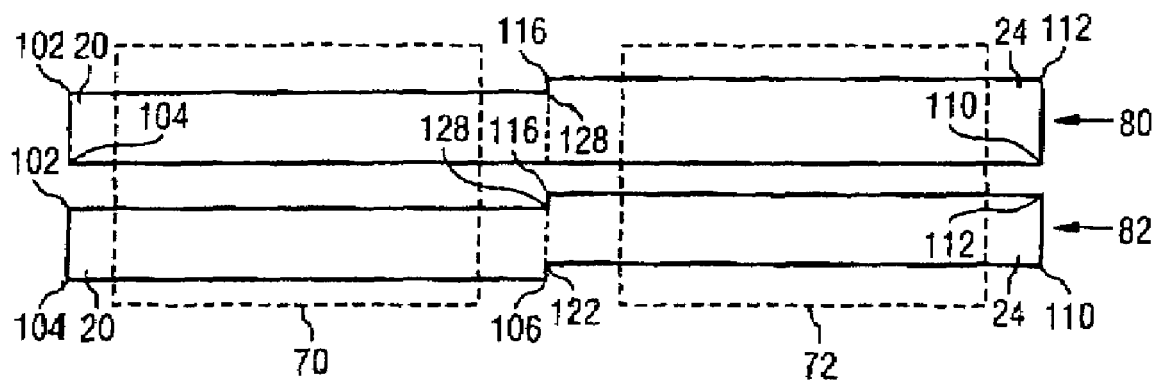

In the text which follows, the allocation of classes to the individual sections and the evaluation of each section by means of evaluation criteria allocated to the various classes is described on the basis of an existing division by means of FIGS. 2 to 4. It is clear that this allocation and evaluation can in each case also be possible and meaningful with another type of division, wherein the evaluation criteria may have to be adapted.

FIG. 2 shows a diagrammatic representation of elemental areas 70, 72 in a first plane, elemental areas 80, 82, 84 in a second plane and elemental area 90, 92, 94 in a third plane of a layout. The elemental areas 70, 72 in the first plane of the layout define shape, size and arrangement of active areas in semiconductor material. The electrical conductivity of these active areas can be influenced by an electrical field which is generated by a gate electrode located above. The elemental areas 80, 82, 84 in the second plane represent, for example, polysilicon patterns having the function of gate electrodes or wiring conductors or conductor pieces, respectively. The elemental areas 90, 92, 94 in the third plane of the layout define shape, size and arrangement of via hole conductors which form an electrically conductive connection in the vertical direction between elements in planes located above one another in the integrated circuit.

Each elemental area 80, 82, 84 in the second plane of the layout is already divided into three sections 20, 22, 24 in FIG. 2. To each of the sections 20, 22, 24, one of a number of predetermined classes is now allocated. This allocation is performed by means of allocation criteria and their logical combinations. For example, the first sections 20 and the third sections 24 in each case overlap the elemental areas 70, 72 in the first plane of the layout which, as mentioned above, represent active areas. The first and third sections 20, 24 of the elemental areas 80, 82, 84 in a second plane of the layout are therefore allocated to the class for gate electrodes.

The second sections 22 of the elemental areas 80, 82, 84 in the second plane of the layout in each case overlap elemental areas 90, 92, 94 in the third plane of the layout which represent vias. For this reason, a class for contact areas for layouts is therefore allocated to the second section 22 of the elemental areas 80, 82, 84 in the second plane of the layout.

To each class, a set of evaluation criteria is allocated which is formed from an evaluation criterion or a number of evaluation criteria combined with one another by boolean means. These evaluation criteria include, in particular, the number of convex corners 102, 104, 106, 108, 110, 112, 114, 116 and the number of concave corners 122, 124, 126, 128 of the edge 16 of the respective elemental area 80, 82, 84 which directly adjoin the respective sections 20, 22, 24.

The first section 20 of the first elemental area 80 is adjoined by two convex corners 102, 104 and two concave corners 122, 128 in the second plane of the layout. The first sections 20 of the second elemental area 82 and of the third elemental area 84 in the second plane of the layout are in each case adjoined only by two convex corners 102, 104 and one concave corner 128.

The third sections 24 of the first elemental area 80 and of the second elemental area 82 in the second plane of the layer are in each case adjoined by two convex corners 110, 112 and two concave corners 124, 126. The third section 24 of the third elemental area 84 in the second plane of the layout is adjoined by two convex corners 110, 112 and one concave corner 126.

The second section 22 of the first elemental area 80 in the second plane of the layout is adjoined by four convex corners 106, 108, 114, 116 and four concave corners 122, 124, 126, 128. The second section 22 of the second elemental area 82 in the second plane of the layout is adjoined by three convex corners 108, 114, 116 and three concave corners 124, 126, 128. The second section 22 of the third elemental area 84 in the second plane of the layout is adjoined by two convex corners 114, 116 and two concave corners 126, 128.

As already mentioned above, a minimization of the number of corners is basically advantageous and desirable. In this sense, the shape of the second elemental area 82 is more advantageous than that of the first elemental area 80 and the shape of the third elemental area 84 is even more advantageous than that of the second elemental area 82. It must be taken into consideration, however, that in the first elemental area 80 and the second elemental area 82, the first sections 20 and the second sections 24 are in each case slightly offset with respect to one another. Since the second section 22 in each case represents a contact area for a via conductor, the width of which is not arbitrary, particularly cannot be selected to be arbitrarily small, one outside edge of the second section 22, at the most, can be aligned with one outside edge of the first section 20 or the second section 24, as a rule, as is the case with the second elemental area 82. In this case, the second section 22 still has three convex corners 108, 114, 116 and three concave corners 124, 126, 128.

In the case of the third elemental area 84, in each case both one edge of the first section 20 and of the second section 22 and in each case one edge of the second section 22 and of the third section 24 are aligned or flush, respectively. Overall, the smallest number of corners therefore occurs. However, this situation cannot always be achieved since a mutual offset of the first section 20 and of the third section 24 is often forced by other boundary conditions.

The situation would look different if the second section 22 did not represent a contact area for a via conductor but a simple straight piece of connecting line. The width of a connecting line is largely freely selectable. For this reason, it must be possible, as a rule, to align a piece of connecting conductor which adjoins other elements on two of the sides, in such a manner that, at the most, two convex corners and two concave corners occur.

Corresponding considerations can also be made for the case where a section of the class for contact areas for via conductors adjoins a single section of the class for gate electrodes or, at two opposite sides, a total of three sections of the class for gate electrodes or, at three different sides, one section of the class for gate electrodes each or, with four different sides, one section of the class for gate electrodes each, etc.

FIG. 3 shows a representation of a further layout or of a further section of a layout. In a first plane of the layout, a first elemental area 70 is arranged which represents an active semiconductor area. In a second plane, elemental area 80, 82 are arranged which, for example, represent polysilicon patterns. In a third plane, elemental areas 90, 92 are arranged which represent via conductors.

The first elemental area 80 and the second elemental area 82 in a second plane of the layout in each case comprise two sections 20, 24 which overlap the elemental area 70, representing an active area, in the first plane of the layout. For this reason, the class of gate electrodes is allocated to sections 20, 24. The sections 22 of the elemental areas 80, 82 in the second plane of the layout overlap the elemental areas 90, 92, representing the via conductors, in the third plane of the layout. For this reason, they are allocated to the class for contact areas for via conductors.

The sections 26, 28, 30, 32, 34, 36, 38 of elemental areas 80, 82 in the second plane do not overlap elemental areas in the immediately adjacent first and third planes. From this, it is concluded that the sections 26 to 38 represent conductor pieces for wiring within the plane.

The sections 28, 32, 36 in each case adjoin two other sections with two opposite sides. They thus represent straight conductor pieces. For this reason, the class for straight conductor pieces is allocated to sections 28, 32, 36.

The sections 26, 34, 38 in each case adjoin other sections with two adjacent sides. They thus represent conductor piece kinks. For this reason, they are allocated the class for conductor piece kinks.

The sections 30 in each case adjoin other sections with three sides. They thus represent conductor piece branches. For this reason, the class for conductor piece branches is to be allocated to section 30.

It can be seen that a section of the class of conductor piece kinks adjoins at least one convex corner 102, 104, 110 and one concave corner 122, 128, 136 as is the case in sections 34 and in the case of the second elemental area 82 also in sections 26 and 38. If a section of the class of conductor piece kinks adjoins two convex corners 104, 106 and/or two concave corners 134, 136, as is the case in sections 26, 38 of the first elemental area 80, this can be prevented, as a rule, by a correction of the layout. This can be easily seen when comparing elemental area 80, 82.

It can also be seen that a section 30 of the class for conductor piece branches adjoins at least two convex corners 124, 130 as is the case with the second elemental area 82. If a section 30 of the class of conductor piece branches adjoins a convex corner 108 and/or three concave corners 124, 130, 132, this can be avoided, as a rule, by a correction of the layout. This can also be easily seen by comparing the elemental area 80; 82.

Corresponding considerations can be made for sections of the class for straight conductor pieces.

FIG. 4 shows a representation of a further layout or of a further section of a layout of an integrated circuit. In a first plane of the layout, two elemental areas 70, 72 are arranged which represent active semiconductor areas. In a second plane of the layout, elemental areas 80, 82 are arranged which represent polysilicon patterns. Each elemental area 80, 82 is divided into a first section 20 and a second section 24. Since each section 20, 24 of both elemental areas 80, 82 in the second plane of the layout overlaps an elemental area 70, 72, representing an active semiconductor area, in the first plane of the layout lying underneath, all sections 20, 24, shown in FIG. 4, of the elemental areas 80, 82 is allocated to the second plane of the layout of the class of gate electrodes. The sections 20, 24 in each case directly adjoin one another.

In the elemental area 80, the sections 20, 24 have different widths. The first section 20 of the first elemental area 80 of the second plane of the layout adjoins two convex corners 102, 104 and one concave corner 128. The second section 24 of the first elemental area 80 adjoins three convex corners 110, 112, 116 and one concave corner 128. The first section 20 of the second elemental area 82 adjoins three convex corners 102, 104, 106 and one concave corner 128. The second section 24 of the second elemental area 82 adjoins three convex corners 110, 112, 116 and two concave corners 122, 128. Since the width, and frequently also the exact arrangement of gate electrodes are predetermined by other boundary conditions, no effective evaluation criterion can be specified, as a rule, for a section of the class of gate electrodes which only adjoins one other section of the class of gate electrodes. This illustrates that the evaluation criteria allocated to a class must take into consideration the classes allocated to the adjoining sections.

On the basis of the considerations represented above by means of FIGS. 2 to 4, the following complex evaluation criteria, for example, which can be represented in each case as a boolean combination of individual criteria, are thus advantageous for various classes:

a section of the class for gate electrodes which adjoins a further section on a single side should adjoin two convex corners and one concave corner, at the most. This evaluation criterion can be differentiated in as much as a section of the class of gate electrodes adjoining a further section of the class of gate electrodes may adjoin more corners, and a section of the class for gate electrodes adjoining a section of the class for contact areas for vias may adjoin up to two convex corners and two concave corners.

A section of the class of contact areas for vias which adjoins a further section on a single side may adjoin up to three convex corners and one concave corner. This evaluation criterion is preferably differentiated in as much as a section of the class of contact areas for vias which adjoins a section of the class for conductor piece kinks on a single side may adjoin two convex corners and one concave corner.

A section of the class for conductor piece kinks which, according to definition, adjoins two other sections on two adjacent sides may adjoin one convex corner and one concave corner.

A section of the class for conductor piece branches which adjoins other sections on three sides should adjoin no more than two concave corners.

A section of the class for straight conductor pieces which, according to definition, adjoins two other sections on two opposite sides should adjoin two concave corners, at the most, if two adjacent sections of the class for conductor piece kinks are allocated. It may adjoin three concave corners if one of the two adjoining sections of the class for conductor piece branches is allocated, and four concave corners if two adjoining sections of the class for conductor piece branches are allocated. The examples of the abovementioned complex evaluation criteria can be differentiated further almost arbitrarily, especially if other classes are defined. Furthermore, corresponding complex evaluation criteria can be defined for further classes.

A section of the class for straight conductor pieces which adjoins two sections, aligned to one another and equally wide, for gate electrodes on two opposite sides should not occur since the two sections of the class for gate electrodes can be extended in order to be connected directly or so that they can be constructed of one piece.

A section of the class for straight conductor pieces which only adjoins one further section should not occur since it does not fulfill a circuit function.

Each complex evaluation criterion can be represented as a boolean combination of simple evaluation criteria. A simple evaluation criterion is, for example, whether the number of adjoining convex corners or the number of adjoining concave corners exceeds a predetermined limit value, the number and the classifications of adjoining sections etc.

It is clear that corresponding evaluation criteria can also be set up for another type of division and also for a layout which has nonrectangular polygons or arbitrarily shaped elemental areas. Instead of the number of convex and concave corners, other criteria for evaluation are also advantageous, wherein evaluation criteria adapted to each class from a plurality of predetermined classes are applied.

Sections of a layout which do not correspond to a (complex) evaluation criterion are characterized, or identified as potentially faulted in a list, file or database. All potentially faulted sections are subsequently checked or evaluated by means of other criteria and possibly identified as actually faulted. This identification is performed, for example, by an engineer who preferably also then corrects the faulted sections at the same time. The corrected layout is later used for producing an integrated circuit for the purpose of which, as a rule, a lithography mask set based on the corrected layout is first generated.

Figure 5:
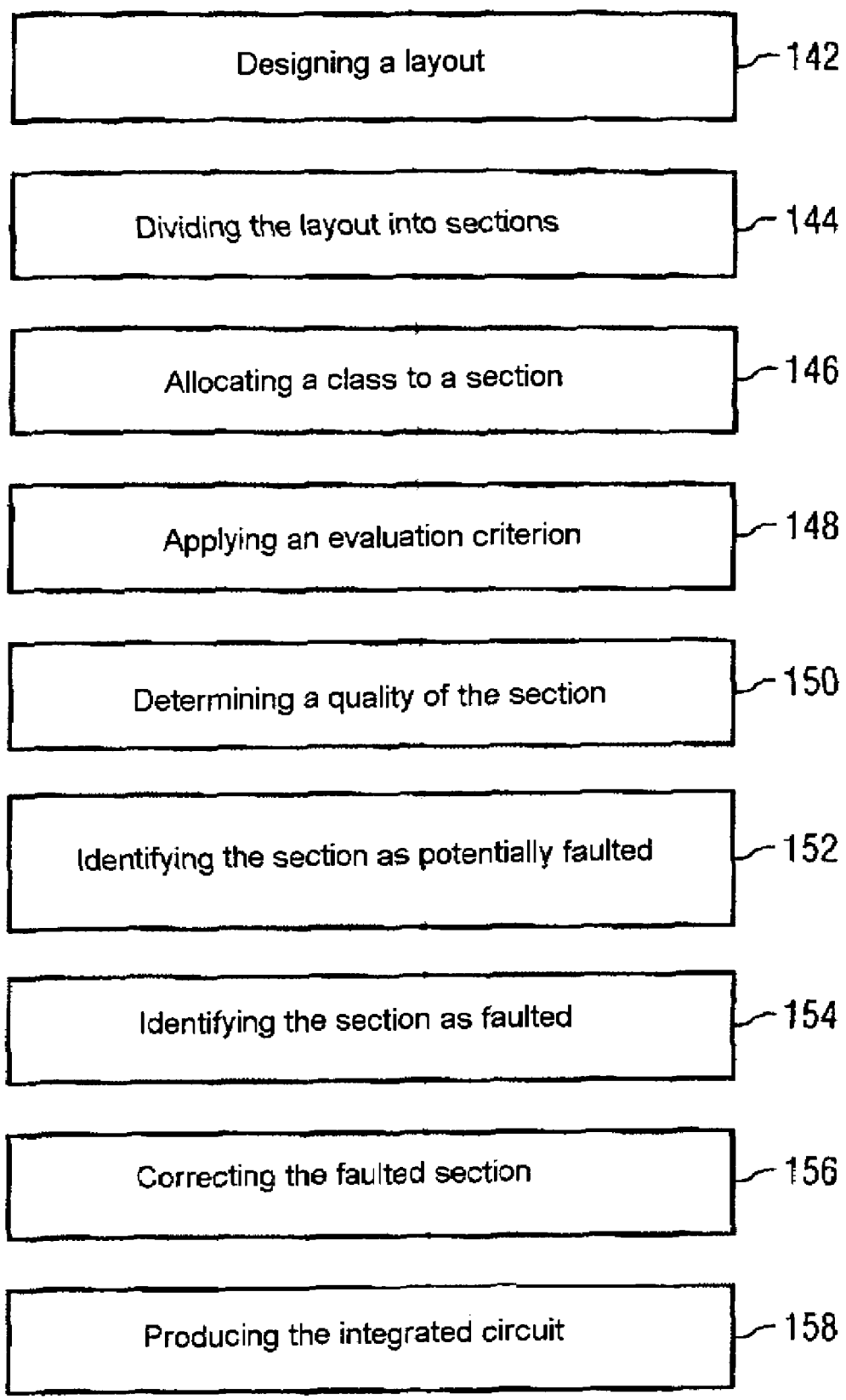
FIG. 5 shows a flowchart of a method according to an embodiment of the present invention.

FIG. 5 shows a flowchart of a method for producing an integrated circuit according to the present invention. This method starts with designing a layout in a first step 142.

The subsequent part of the method from the second step 144 to the eighth step 156 is a method for correcting the layout. The method section from the second step 144 to the sixth step 152 is a method for looking for and identifying potentially faulted sections.

In the second step 144, the layout is described, divided into sections, as described above, particularly by means of FIG. 1. The third step 146, the fourth step 148, the fifth step 150 and the sixth step 152 are preferably performed for each section of the layout created in the second step 144.

In the third step 146, one of a number of predetermined classes is allocated to a section by means of allocation criteria, wherein one or more evaluation criteria in boolean combination are allocated to each class. In the fourth step 148, the evaluation criterion or criteria allocated to the class which was allocated to the section in the third step 146 are applied to the section. This provides one or more evaluation results. From the evaluation result or the evaluation results or their boolean combination, a quality of the sections is determined in a fifth step 150. In the sixth step 152, the section is identified as potentially faulted if the quality of the section determined in the fifth step 150 is less than a predetermined minimum quality. An example of a quality is the ratio between an actual number of convex corners and a desired or, as a rule, achievable number of convex corners. A section can be identified as potentially faulted if this quality is greater than 1 or greater than an arbitrary other predetermined threshold.

In the seventh step 154, a section identified as potentially faulted in the sixth step 152 is evaluated by means of further criteria and possibly identified as actually faulted. In the eighth step 156, the faulted section is corrected.

If all sections identified as potentially faulted in the sixth step 152 and as actually faulted in the seventh step 154 are corrected in the eighth step 156, a corrected layout is present.

On the basis of the corrected layout, a lithography mask set is created in the ninth step 158, by means of which an integrated circuit is subsequently produced.

The method according to the invention described above is preferably implemented in software or firmware.

Some embodiments of the present invention incorporate the finding that concave and convex corners of a layout (jogs and notches) are frequently sources of faults in the production of integrated circuits and particularly in lithography steps, and that corners can generate a high computing effort and lead to faults in conventional design rule checks. For this reason, the number of corners of a layout are reduced as much as possible.

This aspect of the invention is, therefore, based on the concept of allocating to each class a certain maximum number of convex corners and/or a maximum number of concave corners, the transgression of which, as a rule, indicates the presence of a fault.

In some embodiments of the present invention, the method for searching for potential faults is used in a method for correcting a layout which, in turn, according to a further special aspect, is used in a method for producing an integrated circuit.

Some embodiments of the present invention provide the advantage that a potential fault is identified in a quite different manner than in conventional design rule checks. Using the present invention, critical positions or potential faults are therefore identified which have previously remained unnoticed.

Some embodiments of the present invention provide the advantage that the method does not refer to lengths and, therefore, can still be used without changes during the scaling of the layout. For this reason, the method according to the invention is a particularly low-maintenance method.

Some embodiments of the present invention provide the advantage that problems or weak points in a layout are identified at their origin. For this reason, it happens much more rarely than after a conventional design rule check that, instead of a genuine correction of the fundamental problem, the fault message produced is only avoided whilst simultaneously creating another fault which, in turn, however, is not detected by the design rule check.

Some embodiments of the present invention provide the advantage of a particularly compact method which, for its compactness, can also be implemented with particularly few code lines in the software.

The preceding description merely describes advantageous exemplary embodiments of the invention. The features disclosed therein and the claims and the drawings can, therefore, be essential for the realization of the invention in its various embodiments, both individually and in any combination. While the foregoing is directed to embodiments of the present invention, other and further embodiments of this invention may be devised without departing from the basic scope of the invention, the scope of the present invention being determined by the claims that follow.

What is claimed is:

1. A method for searching for potential faults of a layout of an integrated circuit, the layout comprising a plurality of elemental areas which define a shape and arrangement of patterns of the integrated circuit, the method comprising:
   a) dividing the layout into sections;
   b) allocating one of a number of predetermined classes to a section of the sections by means of an allocation criteria, wherein an evaluation criterion is allocated to each class;

c) applying the evaluation criterion allocated to the class which was allocated to the section in step b) to the section to obtain an evaluation result; and d) identifying the section as potentially faulted section in dependence on the evaluation result.

2. The method as claimed in claim 1, in which, in step b), the allocation is made by means of a logical combination of allocation criteria.

3. The method as claimed in claim 2, in which step d) further comprises:
   d1) determining a quality of the section from the evaluation results; and
   d2) identifying the section as potentially faulted if the quality of the section is less than a predetermined minimum quality.

4. The method as claimed in claim 3, in which, in step a), the layout is divided into sections of uniform circuit function.

5. The method as claimed in claim 3, in which, in step a), the layout is divided in accordance with geometric criteria.

6. The method as claimed in claim 1, further comprising allocating to at least one class a number of evaluation criteria, application of which in step c) provides a number of evaluation results, the identification in step d) made based on a logical combination of the evaluation results.

7. The method as claimed in claim 6, in which step d) further comprises:
   d1) determining a quality of the section on the basis of a logical combination of the evaluation results; and
   d2) identifying the section as potentially faulted if the quality of the section is less than a predetermined minimum quality.

8. The method as claimed in claim 7, in which, in step a), the layout is divided into sections of uniform circuit function.

9. The method as claimed in claim 7, in which, in step a), the layout is divided in accordance with geometric criteria.

10. The method as claimed in claim 1, in which step d) further comprises:
    d1) determining a quality of the section from the evaluation results; and
    d2) identifying the section as potentially faulted if the quality of the section is less than a predetermined minimum quality.

11. The method as claimed in claim 10, in which, in step a), the layout is divided into sections of uniform circuit function.

12. The method as claimed in claim 10, in which, in step a), the layout is divided in accordance with geometric criteria.

13. The method as claimed in claim 1, in which steps b), c) and d) are applied to every section.

14. The method as claimed in claim 1, in which, in step a), the layout is divided into sections of uniform circuit function.

15. The method as claimed in claim 1, in which, in step a), the layout is divided in accordance with geometric criteria.

16. The method as claimed in claim 15, in which a boundary between two sections is formed by extending a straight edge section beyond a concave corner adjoining the straight edge section.

17. The method as claimed in claim 1, in which one of the number of predetermined classes is included in the group which comprises a class for gate electrodes, a class for contact areas for via conductors, a class for straight conductor pieces, a class for conductor piece kinks and a class for a conductor piece branch.

18. The method as claimed in claim 1, in which an evaluation criterion is formed by a number of convex corners, adjoining a section, in an edge of an elemental area, a component of which the section is.

19. The method as claimed in claim 1, in which an evaluation criterion is formed by a number of concave corners, adjoining a section, in an edge of an elemental area, a component of which the section is.

20. A method for correcting a layout of an integrated circuit, the layout comprising a plurality of elemental areas which define a shape and arrangement of patterns of the integrated circuit, the method comprising:
   a) searching for potentially faulted sections of the layout, comprising;
      i) dividing the layout into sections;
      ii) allocating one of a number of predetermined classes to a section of the sections by means of an allocation criteria, wherein an evaluation criterion is allocated to each class;
      iii) applying the evaluation criterion allocated to the class which was allocated to the section in step ii) to the section to obtain an evaluation result; and
      iv) identifying the section as potentially faulted section in dependence on the evaluation result;
   b) identifying a potentially faulted section as actually faulted by means of further criteria; and
   c) correcting a section if it has been identified as actually faulted.

* * * * *